US009565777B1

(12) United States Patent  
Arvin et al.

(10) Patent No.: US 9,565,777 B1
(45) Date of Patent: Feb. 7, 2017

(54) SECURITY MESH AND METHOD OF MAKING

(71) Applicant: International Business Machines Corporation, Armonk, NY (US)

(72) Inventors: Charles L. Arvin, Savannah, GA (US); Brian M. Erwin, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/970,165

(22) Filed: Dec. 15, 2015

(51) Int. Cl.
*H05K 3/46* (2006.01)
*H05K 1/09* (2006.01)
(Continued)

(52) U.S. Cl.
CPC ............ *H05K 3/4602* (2013.01); *C25D 11/04* (2013.01); *C25D 11/045* (2013.01); *C25D 11/16* (2013.01); *H05K 1/00* (2013.01); *H05K 1/0393* (2013.01); *H05K 1/09* (2013.01); *H05K 1/115* (2013.01); *H05K 1/16* (2013.01); *H05K 3/06* (2013.01); *H05K 3/4644* (2013.01); *H05K 3/4682* (2013.01); *H05K 3/4697* (2013.01); *H05K 2203/033* (2013.01); *H05K 2203/0307* (2013.01); *H05K 2203/0315* (2013.01); *H05K 2203/0369* (2013.01); *H05K 2203/0392* (2013.01); *H05K 2203/0733* (2013.01); *H05K 2203/1142* (2013.01)

(58) Field of Classification Search
None
See application file for complete search history.

(56) References Cited

U.S. PATENT DOCUMENTS

| 5,539,379 A | 7/1996 | MacPherson |
| 6,534,416 B1 * | 3/2003 | Ye .............................. C23F 4/00 216/67 |

(Continued)

FOREIGN PATENT DOCUMENTS

| GB | 2385823 B | 7/2005 |
| JP | 2004-179291 | * 6/2004 ............... H05K 1/05 |

OTHER PUBLICATIONS

List of IBM patents or Patent Applications Treated as Related; (Appendix P), Date Filed Sep. 22, 2016 2 pages.

(Continued)

*Primary Examiner* — Jiong-Ping Lu
(74) *Attorney, Agent, or Firm* — Cantor Colburn LLP; Bryan Bortnick

(57) ABSTRACT

A method of making a security mesh comprises forming on a conductive substrate an alumina film having through-holes in which metal, e.g., copper, through-wires are formed. First surface wires are formed on one surface of the alumina film and second surface wires are formed on the second, opposite surface of the alumina film in order to connect selected through-wires into a continuous undulating electrical circuit embedded within the alumina film. The security mesh product comprises an alumina film having a continuous undulating electrical circuit comprising copper or other conductive metal extending therethrough. A stacked security mesh comprises two or more of the mesh products being stacked one above the other.

15 Claims, 6 Drawing Sheets

(51) Int. Cl.
*H05K 1/11* (2006.01)
*H05K 3/06* (2006.01)
*C25D 11/04* (2006.01)
*C25D 11/16* (2006.01)
*H05K 1/00* (2006.01)
*H05K 1/16* (2006.01)
*H05K 1/03* (2006.01)

(56) References Cited

U.S. PATENT DOCUMENTS 6,982,642 B1 1/2006 Cesana et al.
2010/0024046 A1 1/2010 Johnson, Jr. et al.

OTHER PUBLICATIONS

U.S. Appl. No. 15/271,800, filed Sep. 21, 2016; Entitled: Security Mesh and Method of Making.

* cited by examiner

SECURITY MESH AND METHOD OF MAKING

BACKGROUND

The present invention relates to security meshes having a meandering electric circuit formed therein, and to a method of making the same.

Electronic components containing information which must be protected against access or tampering are enclosed in a security barrier which typically comprises a security mesh, sometimes referred to as a security wrap, which contains an electric circuit which, if interrupted or altered, will initiate a destruct or invalidation sequence to destroy or erase critical information, such as decryption or encryption keys, contained in the secured electronic device. For example, a cryptographic processor card may be enclosed within the security mesh. The interruption or alteration of the mesh internal circuit may be caused by a probe which pierces the security wrap in an attempt to access the secured electronic device. The security mesh is typically connected in electric signal communication with a device which, upon sensing an interruption or alteration in the mesh internal circuitry, will initiate an action to protect the critical information, such as erasing stored key codes for encryption and decryption of the secured information.

There are solutions to the problem of providing a physical security enclosure that can detect attempts to physically bypass the security wrap and which are difficult to circumvent. Generally, a security wrap capable of detecting physical tampering is wrapped and glued in place around a device or container to create an enclosure within which an electronic component or device that must be physically protected may be secured. In the event of a physical breach of the security wrap, an electrical connection between the wrap internal circuitry and the device will trigger an erase/destruct sequence to protect data on the component or device. The security wrap is treated much like a piece of 'wrapping paper' such that the device can be fully enclosed. Adhesive is put in place to keep the security wrap from unfolding. The security wrap should be so designed that damage to the adhesive will result in damage or alteration to the wrap circuitry that is sufficient to trigger the erase/destruct sequence. The security wrap may have apertures formed therein to enable wires to enter and exit the enclosure to make electrical connections between the mesh internal circuitry and the erase/destruct sequence device. The same or additional apertures may also allow for pressure equalization.

Security wraps are typically comprised of multi-layer laminated plastic sheets which encase multiple layers of security mesh containing fine pitch wiring that leads to electrical connectors to the secured device or component. The plastic sheets are wrapped around the secured device or component with the wiring connectors being placed on the interior of the sheet. The wiring connectors are then connected to one or more erase/destruct tamper features on the secured device.

SUMMARY

In accordance with the present invention there is provided a method of making a security mesh comprising indenting an aluminum film having a first surface and an opposite second surface to form a pattern of indentations in the first surface. The resulting indented aluminum film is then anodized to convert the aluminum film to an alumina film having a first surface and an opposite second surface and to form from the indentations through-holes extending through the resulting alumina film. A conductive metal, for example, copper, is deposited onto the first surface of the alumina film to form a plurality of through-wires in the through-holes and a first metal, e.g., copper, film on the first surface of the alumina film. The resulting through-wires have respective first ends at or adjacent to the first surface of the alumina film and respective second ends at or adjacent to the second surface of the alumina film. The first metal film is etched to form on the first surface of the alumina film a plurality of first metal surface wires connecting the first ends of selected through-wires to each other to thereby form a partially wired alumina film. A second metal, e.g., copper, film is applied to the second surface of the alumina film, and the second metal film is etched to form on the second surface of the alumina film a plurality of second metal surface wires connecting the second ends of selected through-wires to each other, the first and second surface wires being connected to the through-wires so as to form a continuous undulating wire circuit through the alumina film.

Another method aspect of the present invention for making a security mesh comprises the following steps. Evaporation or sputtering is used to deposit an aluminum film onto a conductive substrate, the aluminum film having a first exposed surface and an opposite second surface facing the substrate. The aluminum film is mechanically indented to form a pattern of indentations in the first surface, the indentations being spaced apart from each other a distance from about 40 to 800 nanometers. The resulting indented aluminum film is then anodized to convert the aluminum film to an alumina film having a first surface and an opposite second surface and to form from the indentations through-holes having a diameter of from about 20 to 400 nanometers extending through the resulting alumina film. Copper is electroplated onto the first surface of the alumina film to form a plurality of through-wires in the through-holes, the through-wires having respective first ends at or adjacent to the first surface of the alumina film and respective second ends at or adjacent to the second surface of the alumina film. A first copper film is sputtered onto the first surface of the alumina film and the first copper film is etched to form on the first surface of the alumina film a plurality of first copper surface wires connecting the first ends of selected through-wires to each other to thereby form a partially wired alumina film. The partially wired alumina film is released from the conductive substrate to expose the second surface of the alumina film. A second copper film is sputtered onto the second surface of the alumina film and then is etched to form on the second surface of the alumina film a plurality of second copper surface wires connecting the second ends of selected through-wires to each other, the first and second surface wires being connected to the through-wires so as to form a continuous undulating wire circuit through the alumina film.

Another aspect of the present invention provides a security mesh comprising an alumina film having a first surface and an opposite second surface and a plurality of electrically conductive metal, for example, copper, through-wires extending from the first surface to the second surface, the through-wires terminating in respective opposite first and second ends with the first ends exposed to the first surface and the second ends exposed to the second surface. First metal, e.g., copper, surface wires are disposed on the first surface and connect selected ones of the first ends in electric conducting communication with each other, and second metal, e.g., copper, surface wires are disposed on the second surface and connect selected ones of the second ends in electric conducting communication with each other, to provide a continuous undulating metal wire circuit extending through the alumina film.

As used herein an in the claims, reference to "aluminum" means and includes aluminum and aluminum alloys containing at least 60% by weight aluminum.

Commercially available aluminum alloys, including aluminum alloys designated 2024 and 7075, to name but two, as well as unalloyed aluminum may be used. Typical alloying metals are copper, zinc and manganese.

As used herein and in the claims, reference to "alumina" means and includes the product of anodizing aluminum or an aluminum alloy to convert aluminum to aluminum oxide, and reference to "copper" means and includes copper and copper alloys suitable for the described purpose.

DETAILED DESCRIPTION

Security meshes typically comprise layers of a dielectric such as plastic sheeting on which are formed electrically conductive trace lines constituting a mesh electric circuit. Damage to or alteration of any of the conductive traces within the layered fabric changes the resistance of the mesh circuit and will trigger an erase/destruct action to protect the secured electronic device. It is of course highly desirable that the electrical circuit be very close-knit so as to reduce to the extent feasible those portions of the security mesh which may be penetrated by a probe or the like without damaging or altering the electrical circuit.

Security wraps present problems including that the security wrap limits heat removal of the device, thus gating its performance. In addition, controlled unwrapping of the security wrap from the device, where the adhesive is carefully moved out of place and precise cuts are made in the security wrap, may avoid the creation of breaks in the fine pitch wiring of the security wrap and thus fail by permitting physical access for analysis of the secured device.

Figure 1:
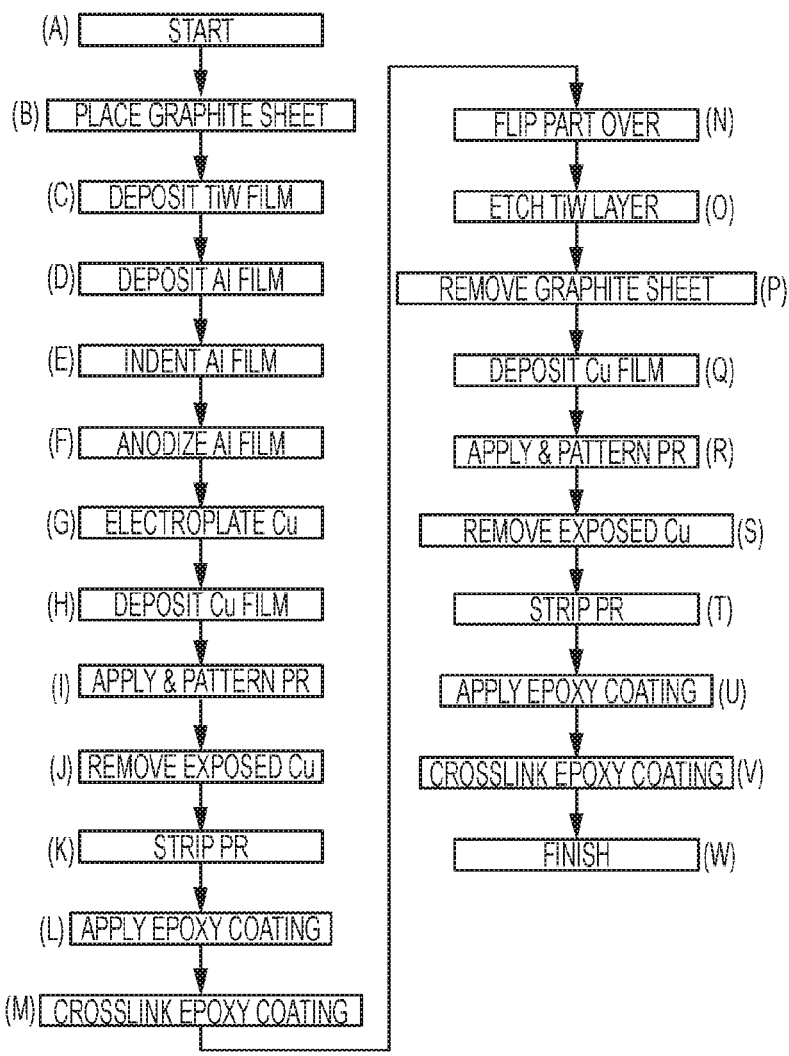
FIG. 1 is a flow chart showing steps (A) through (W) of a manufacturing process in accordance with one embodiment of the present invention.

FIG. 1 shows a flow chart of process steps (A) through (W) for manufacturing a security mesh in accordance with one embodiment of the present invention. The specific materials identified in FIG. 1 are exemplary only and other suitable materials may be substituted. The process starts at step (A) by placing in step (B) an electrically conductive sheet, such as graphite sheet 10, upon a support (not shown) and in step (C) depositing an adhesion film, for example, by sputtering a titanium-tungsten film 12, onto the graphite sheet 10. The graphite sheet 10 may be replaced by a sheet of any other suitable electrical conducting material such as copper or other suitable metal.

Figure 2:
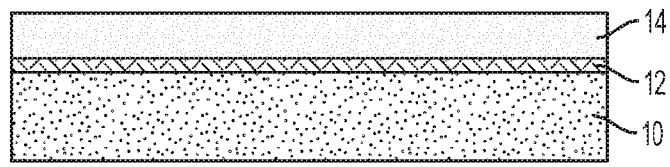
FIG. 2 is a schematic elevation view in cross section of a work piece as it appears after step (D) of FIG. 1.

In step (D), an aluminum film 14 (which may comprise any suitable aluminum alloy) is deposited by evaporation or sputtering onto the adhesion layer 12 to form a film which may be about 10 to 100 nanometers ("nm") thick, for example, from about 15 to 40 nm thick. A thickness of from about 18 to 22 nm, e.g., about 20 nm, is suitable for the aluminum film 14. The resulting work piece is shown in FIG. 2.

Figure 3:
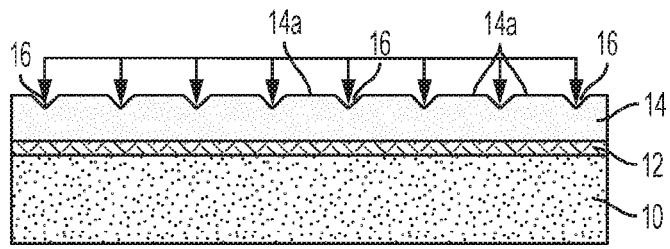
FIG. 3 is a view corresponding to FIG. 2 but after step (E) of FIG. 1.
Figure 3A:
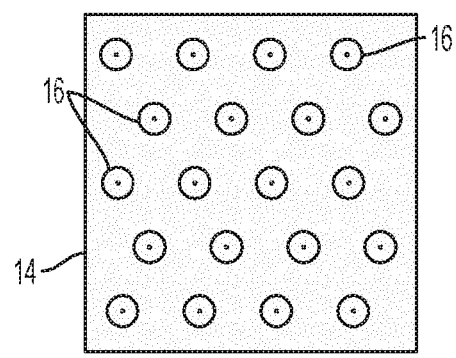
FIG. 3A is a top plan view of FIG. 3.
Figure 4:
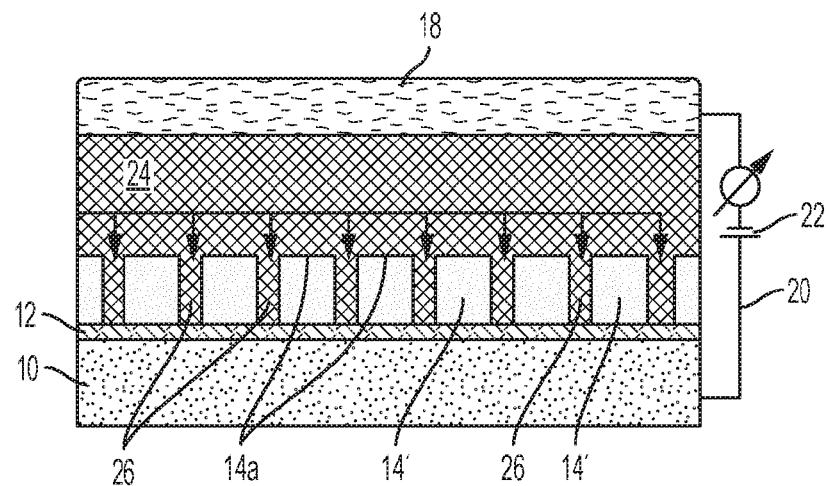
FIG. 4 is a schematic cross-sectional elevation view illustrating step (F) of FIG. 1.
Figure 5:
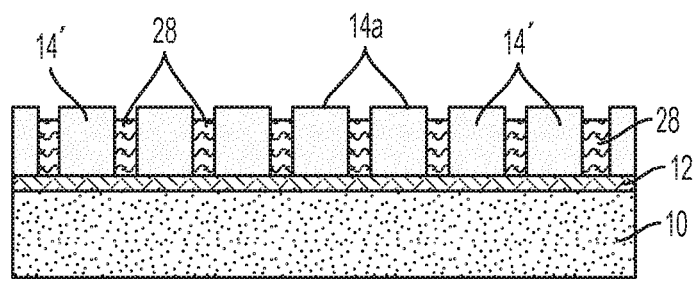
FIG. 5 is a schematic cross-sectional view of the work piece after step (G) of FIG. 1.
Figure 5A:
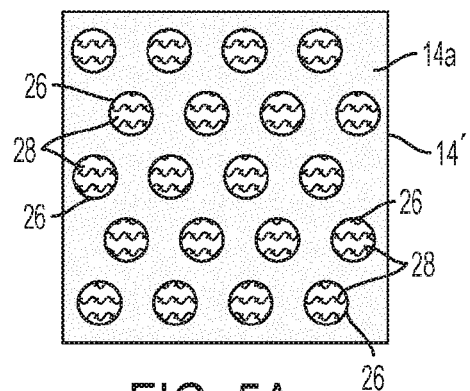
FIG. 5A is a top plan view of the surface of the work piece of FIG. 5.

Step (E) of FIG. 1 is then carried out by mechanically indenting the aluminum film 14 as shown in FIG. 3 to provide in the first surface 14a of aluminum film 14 a series of indentations 16 in a desired pattern, as indicated in FIG. 3A. A suitable pattern of indentations 16 is the hexagonal pattern illustrated in FIG. 3A. The indentations 16 may be spaced apart from each other a distance from about 40 to 800 nanometers, for example, from about 0.3 to about 0.5 microns apart. A distance of about 0.4 microns is suitable. The aluminum film 14 is then anodized (step (F) of FIG. 1). Any suitable anodization process may be utilized and a suitable arrangement is schematically illustrated in FIG. 4 in which a cathode 18 is electrically connected by a conductor 20 to graphite sheet 10 and supplied with an electric power source 22 to anodize the aluminum film 14 in an electrolytic bath 24. Bath 24 may be, for example, a sulfuric acid bath, an oxalic acid bath or a phosphoric acid bath. The anodization process converts the aluminum in the aluminum film 14 to aluminum oxide and creates through-holes 26 through the resulting alumina film 14', at the locations of indentations 16. The through-holes 26 may have a diameter of, for example, from about 20 to 400 nm. The cross-sectional view of FIG. 4 shows the resulting alumina film 14' having a series of through-holes 26 formed therein. The assembly of the graphite sheet 10, adhesion layer 12 and the now perforated alumina film 14' is removed from the anodizing bath and rinsed. Step (G) of FIG. 1 is then carried out to electroplate a copper (or other suitable metal) deposit onto the top surface 14a of alumina film 14' so as to fill the through-holes 26 (FIG. 4) with copper to form copper through-wires 28 (FIG. 5) extending through the through-holes 26 of alumina film 14'. The plan view of FIG. 5A shows the copper through-wires 28 extending through alumina film 14' via through-holes 26 in a pattern corresponding to the pattern of indentations 16 shown in FIG. 3A.

Figure 6:
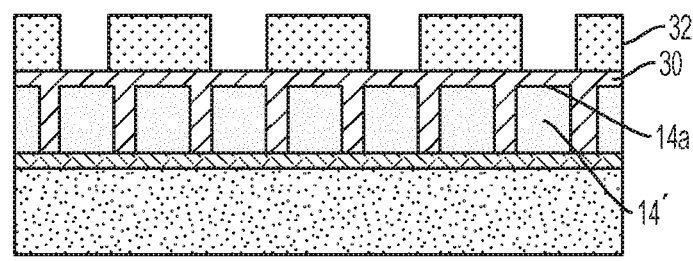
FIG. 6 is a schematic cross-sectional view in elevation of the work piece after step (I) of FIG. 1.
Figure 7:
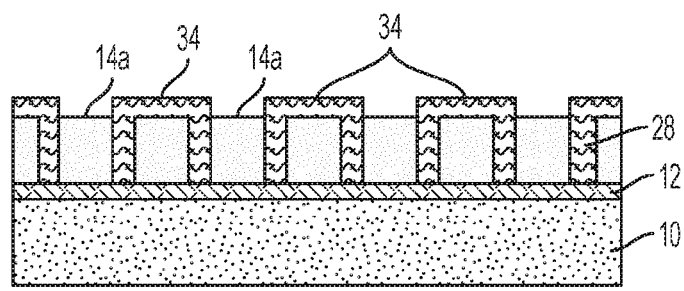
FIG. 7 is a schematic cross-sectional view in elevation of the work piece after steps (J) and (K) of FIG. 1.
Figure 7A:
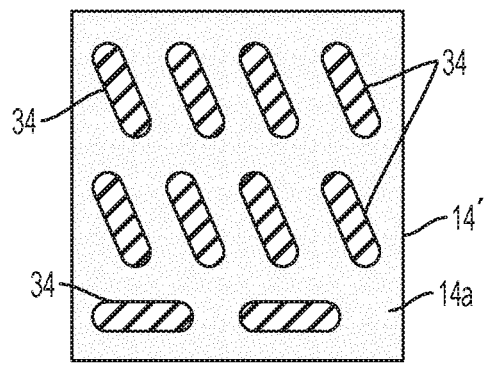
FIG. 7A is a top plan view of the work piece of FIG. 7.
Figure 8:
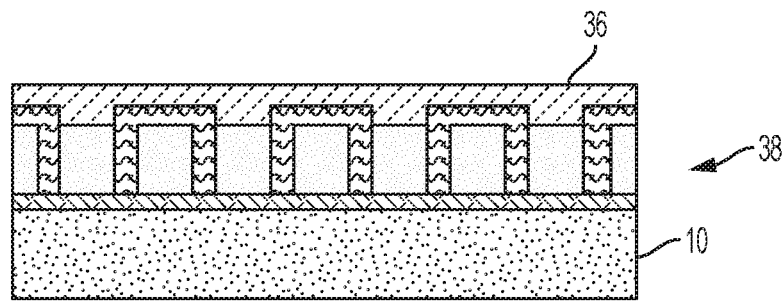
FIG. 8 is a schematic cross-sectional view in elevation of the work piece after steps (L) and (M) of FIG. 1.
Figure 9:
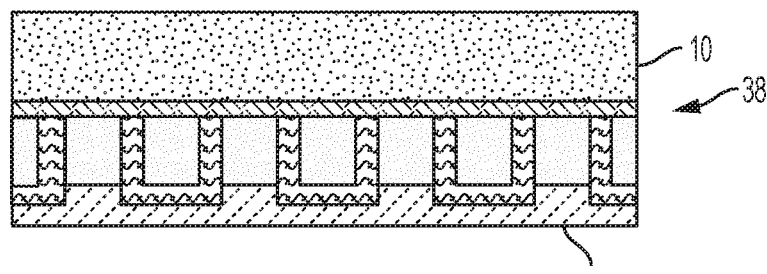
FIG. 9 is a schematic cross-sectional view in elevation of the work piece after step (N) of FIG. 1.

Step (H) of FIG. 1 is then carried out to deposit a first copper (or other suitable metal) film 30 (FIG. 6) onto the first surface 14a of alumina film 14'. A photoresist layer is deposited upon first copper film 30 and suitably etched in the conventional manner to provide a patterned photoresist layer on first copper film 30 pursuant to step (I) of FIG. 1. The pattern is formed in a photoresist 32 so that upon etching, the exposed portions of copper film 30 are removed in step (J). The photoresist 32 is then stripped away as indicated in step (K) of FIG. 1, resulting in the structure illustrated in FIGS. 7 and 7A wherein selected copper through-wires 28 are connected by a plurality of first surface wires 34. A suitable first protective layer, such as an epoxy layer 36, is then applied over surface 14a of alumina film 14', pursuant to step (L), and in the case of an epoxy layer is crosslinked by UV or thermal treatment pursuant to step (M) of FIG. 1. The resulting work piece 38 is shown in FIG. 8. Work piece 38 is flipped over as indicated in step (N) of FIG. 1 and shown in its flipped-over orientation in FIG. 9.

Figure 10:
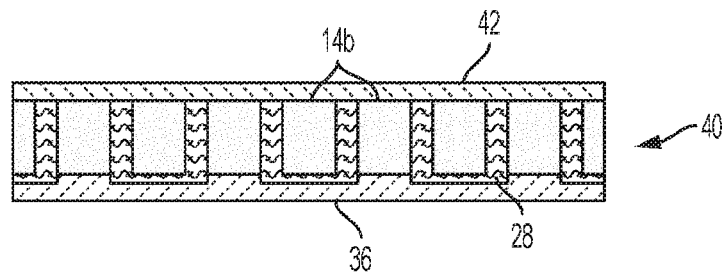
FIG. 10 is a schematic cross-sectional view in elevation of the work piece after steps (O) and (P) of FIG. 1.

The titanium-tungsten adhesion layer 12 is then etched away in accordance with step (O) of FIG. 1 and the graphite sheet 10 is then removed pursuant to step (P), resulting in the work piece 40 illustrated in FIG. 10. As called for by step (Q) of FIG. 1, a second copper (or other suitable metal) film 42 (FIG. 10) having a thickness of about 1 micron is sputtered upon second surface 14b.

Figure 11:
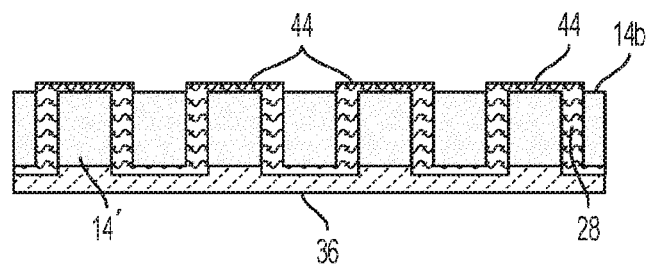
FIG. 11 is a schematic cross-sectional view in elevation of the work piece after steps (Q) through (T) of FIG. 1.

Steps (R), (S) and (T) of FIG. 1 are then performed in a manner similar or identical to steps (I), (J) and (K) of FIG. 1 to provide a plurality of second surface wires 44 (FIG. 11) disposed on second surface 14b of alumina film 14'. Steps (U) and (V) of FIG. 1 are then performed in a manner similar or identical to steps (L) and (M) of FIG. 1 to provide a second protective layer, such as a crosslinked second epoxy layer 46. This finishes the process as indicated by step (W) of FIG. 1 to provide a security mesh 48 in accordance with one embodiment of the present invention.

More specifically, the method of the present invention provides for the aluminum film to be deposited on a conductive substrate, for example, a graphite or copper substrate, with the first surface of the aluminum film exposed and the second surface facing the substrate. A first photoresist layer is applied to the first metal film and a patterned portion of the first photoresist layer is removed to expose portions of the first metal film, and the exposed portions are etched to form the first metal surface wires, after which the first photoresist layer is stripped from the first metal film. The partially wired alumina film is then released from the conductive substrate to expose the second surface of the alumina film prior to applying the second metal film to the second surface of the alumina film. A second photoresist layer is applied to the second metal film and a patterned portion of the second photoresist layer is removed to expose portions of the second metal film. The exposed portions of the second metal film are etched to form the second metal surface wires, and the second photoresist layer is then stripped from the second metal film.

The method of the present invention may also provide one or more of the following features, alone or in any suitable combination. The plurality of metal through-wires may be formed by electroplating the conductive metal onto the first surface of the alumina film, and forming the first metal film in a separate metal sputtering step; the conductive substrate may be selected from the group consisting of graphite and copper; a suitable first protective layer, for example, a first epoxy layer, may be applied to the first metal film after stripping of the first photoresist layer and then cured; a second suitable protective layer, for example, a second epoxy layer, may be applied to the second metal film after stripping the second photoresist layer, and then cured; an adhesion layer, for example, one comprising a titanium-tungsten alloy, may be applied onto the conductive substrate and the aluminum film is deposited on the conductive adhesion layer substrate, then depositing the aluminum film onto the adhesion layer. The adhesion layer is then removed prior to releasing the partially wired alumina film from the substrate.

Figure 12:
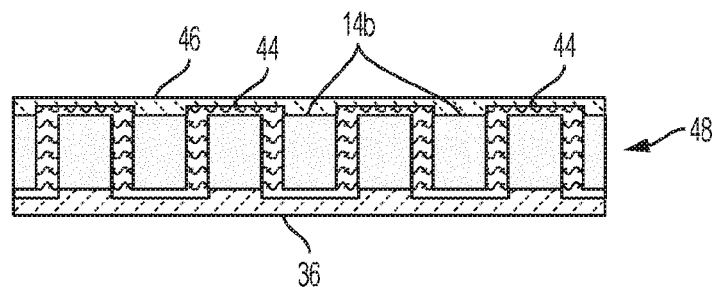
FIG. 12 is a schematic cross-sectional view in elevation after steps (V) and (W) of FIG. 1 of the finished security mesh product of the process of FIG. 1.
Figure 12A:
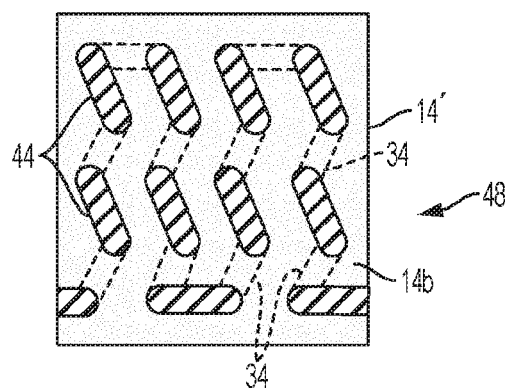
FIG. 12A is a top plan view of the security mesh product of FIG. 12.

As shown in FIG. 12 and FIG. 12A, the result is a continuous very fine pitch copper (or other suitable metal) wire circuit distributed in a generally hexagonal pattern through the depth of alumina film 14'. The copper wire circuit is comprised of first surface wires 34 disposed on first surface 14a and shown in phantom outline in FIG. 12A, first surface wires 34 being connected by through-wires 28 (not visible in FIG. 12A) to second surface wires 44 disposed on second surface 14b.

The security mesh of the present invention may comprise a first protective layer disposed over the first metal surface wires and the first surface of the alumina film and coextensive with the first surface, and a second protective layer disposed over the second metal surface wires and the second surface of the alumina film and coextensive with the second surface. The first and second protective layers may each comprise a cured epoxy layer.

It has been found that if the thickness of alumina film 14' does not exceed about 40 nanometers, preferably does not exceed 20 nanometers, alumina film 14' is capable of being folded around a device or enclosure without significant or deleterious cracking in much the same manner as plastic sheets having trace wiring imprinted or embossed upon them may be folded.

If the security mesh of the present invention is made with an alumina film significantly thicker than about 40 nanometers, for example, from about greater than 40 to about 100 nanometers thickness, the mesh may be used as panels which may be laminated onto a device or a package or enclosure containing an electronic device which is to be protected against a physical probe.

Figure 13:
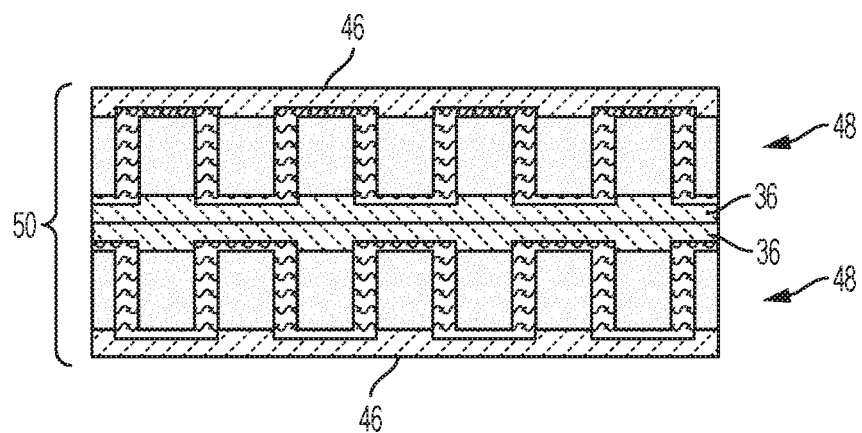
FIG. 13 is a schematic cross-sectional view in elevation of an embodiment of the present invention in which two of the security mesh product of FIGS. 12 and 12A are stacked to form a multi-layer security mesh product.

Whether in foldable film or laminate form, two or more of the security meshes 48 may be stacked one upon the other as illustrated in FIG. 13 to provide a stacked security mesh 50 which has double the density of fine pitch meandering circuitry extending through the alumina film as compared to the single layer version of FIG. 12. The circuitry in the two or more stacked layers may be connected to each other to form a single, multi-layer circuit or the circuitry of each security mesh 48 may be independently connected to an appropriate erase/destruct device of the electronic component being protected. Such connections are not shown in FIG. 13. Stacking the layers increases the density of the circuitry encased within the alumina film and thereby increases the protection by increasing the difficulty of penetrating the security mesh without triggering an erase/destruct sequence. The very small distances between through-holes 26 results in a very close-packed fine pitch circuitry which is very advantageous in defeating attempts to penetrate the security mesh of the present invention. The close-packed very fine pitch of the circuitry also helps to defeat X-ray inspection of the security mesh by anyone seeking a location to enter a probe without damaging or altering the circuitry. Further, the epoxy layers 36 and 46 may be darkened and/or patterned to help camouflage the pattern of the circuitry.

It will be appreciated that the fine pitch circuitry comprised of the through-wires 28 and first and second surface wires 34, 44 will be connected in the known manner to an erase/destruct device so that rupture or grounding of the mesh circuitry encased within alumina film 14' will trigger the erase/destruct sequence.

The security mesh of the present invention, may, in the known manner, be coupled with a range of other security trigger devices that provide sensitivity to methods of attack other than physical penetration of the security mesh, such as attack by temperature, pressure, vibration, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a security mesh comprising:
    indenting an aluminum film having a first surface and an opposite second surface to form a pattern of indentations in the first surface, depositing the aluminum film on a conductive substrate with the first surface of the aluminum film exposed and the second surface facing the substrate, and anodizing the resulting indented aluminum film to convert the aluminum film to an alumina film having a first surface and an opposite second surface and to form from the indentations through-holes extending through the resulting alumina film;
    depositing a conductive metal onto the first surface of the alumina film to form a plurality of through-wires in the through-holes and a first metal film on the first surface of the alumina film, the through-wires having respective first ends at or adjacent to the first surface of the alumina film and respective second ends at or adjacent to the second surface of the alumina film, applying a first photoresist layer to the first metal film and removing a patterned portion of the first photoresist layer to expose portions of the first metal film, etching the exposed portions of the first metal film to form on the first surface of the alumina film a plurality of first metal surface wires, connecting the first ends of selected through-wires to each other to thereby form a partially wired alumina film, and then stripping the first photoresist layer from the first metal film;
    releasing the partially wired alumina film from the conductive substrate to expose the second surface of the alumina film and then applying a second metal film to the second surface of the alumina film;
    applying a second photoresist layer to the second metal film and removing a patterned portion of the second photoresist layer to expose portions of the second metal film; and
    etching the exposed portions of the second metal film to form on the second surface of the alumina film a plurality of second metal surface wires, connecting the second ends of selected through-wires to each other, the first and second surface wires being connected to the through-wires so as to form a continuous undulating wire circuit through the alumina film; and then stripping the second photoresist layer from the second metal film.

2. The method of claim 1 wherein the conductive metal comprises copper and the aluminum film has a thickness of from about 10 to about 100 nanometers.

3. The method of claim 1 further comprising forming the plurality of metal through-wires by electroplating the conductive metal onto the first surface of the alumina film, and forming the first metal film in a separate metal sputtering step.

4. The method of claim 1 wherein the conductive substrate is selected from the group consisting of graphite and copper.

5. The method of claim 4 wherein the conductive metal comprises copper.

6. The method of claim 1 further comprising applying a first protective layer to the first metal film after stripping of the first photoresist layer and then curing the first protective layer, applying a second protective layer to the second metal film after stripping the second photoresist layer, and then curing the second protective layer.

7. The method of claim 6 wherein the first protective layer comprises a first epoxy layer and the second protective layer comprises a second epoxy layer.

8. The method of claim 1 further comprising applying an adhesion layer onto the conductive substrate and then depositing the aluminum film onto the adhesion layer, and then removing the adhesion layer prior to releasing the partially wired alumina film from the substrate.

9. The method of claim 8 wherein the adhesion layer comprises a titanium-tungsten alloy layer.

10. A method of making a security mesh comprising:
    depositing by evaporation or sputtering an aluminum film onto a conductive substrate, the aluminum film having a first exposed surface and an opposite second surface facing the substrate;
    mechanically indenting the aluminum film to form a pattern of indentations in the first surface, the indentations being spaced apart from each other a distance from about 40 to 800 nanometers;
    anodizing the resulting indented aluminum film to convert the aluminum film to an alumina film having a first surface and an opposite second surface and to form from the indentations through-holes having a diameter of from about 20 to 400 nanometers extending through the resulting alumina film;
    electroplating copper onto the first surface of the alumina film to form a plurality of through-wires in the through-holes, the through-wires having respective first ends at or adjacent to the first surface of the alumina film and respective second ends at or adjacent to the second surface of the alumina film;
    sputtering a first copper film onto the first surface of the alumina film;
    etching the first copper film to form on the first surface of the alumina film a plurality of first copper surface wires connecting the first ends of selected through-wires to each other to thereby form a partially wired alumina film;
    releasing the partially wired alumina film from the conductive substrate to expose the second surface of the alumina film;
    sputtering a second copper film onto the second surface of the alumina film; and
    etching the second copper film to form on the second surface of the alumina film a plurality of second copper surface wires connecting the second ends of selected through-wires to each other, the first and second surface wires being connected to the through-wires so as to form a continuous undulating wire circuit through the alumina film.

11. The method of claim 10 wherein the conductive substrate is selected from the group consisting of graphite and copper.

12. The method of claim 10 further comprising applying an adhesion layer onto the conductive substrate prior to depositing the aluminum film on the conductive substrate, then depositing the aluminum film onto the adhesion layer, and removing the adhesion layer prior to releasing the partially wired alumina film from the substrate.

13. The method of claim 12 wherein the adhesion layer comprises a titanium-tungsten film and the conductive substrate is selected from the group consisting of graphite and copper.

14. The method of claim 10 further comprising applying a first protective layer to the first alumina surface after the first copper surface wires are formed thereon and curing the first protective layer, and applying a second protective layer to the second alumina surface after the second copper surface wires are formed thereon and curing the second protective layer.

15. The method of claim 14 wherein the first protective layer comprises a first epoxy layer and the second protective layer comprises a second epoxy layer.

\* \* \* \* \*